United States Patent [19]

Murray et al.

[11] Patent Number: 5,164,737
[45] Date of Patent: Nov. 17, 1992

[54] SINGLE TURN FERRITE ROD ANTENNA WITH MOUNTING STRUCTURE

[75] Inventors: Bradley A. Murray, Lantana; Edward L. Ehmke; Philip P. Macnak, both of West Palm Beach, all of Fla.

[73] Assignee: Motorola, Inc., Schaumburg, Ill.

[21] Appl. No.: 676,394

[22] Filed: Mar. 28, 1991

[51] Int. Cl.⁵ ............... H01Q 1/220; H01Q 7/060; H01Q 7/080
[52] U.S. Cl. ..................................... 343/702; 343/788
[58] Field of Search ............... 361/396, 400, 401, 412, 361/417, 419, 420; 343/787, 788, 702, 878; 336/65, 192

[56] References Cited
U.S. PATENT DOCUMENTS

| | | | |
|---|---|---|---|
| 3,267,478 | 8/1966 | Schiefer | 343/788 |
| 3,594,805 | 7/1971 | Chardin | 343/746 |
| 4,275,400 | 6/1981 | Miyakoshi | 343/788 |
| 4,618,915 | 10/1986 | Bury | 361/420 |
| 4,667,270 | 5/1987 | Yagi | 361/420 |
| 4,672,685 | 6/1987 | Phillips et al. | 343/702 |
| 4,688,867 | 8/1987 | Reichardt | 361/401 |
| 4,795,991 | 1/1989 | Saito et al. | 361/400 |
| 4,805,232 | 2/1989 | Ma | 455/291 |
| 4,814,782 | 3/1989 | Chai | 343/787 |
| 4,849,765 | 7/1989 | Marko | 343/702 |

OTHER PUBLICATIONS

Dickens et al., Improved Coil Bobbin, AT&T Technical Digest No. 76, Mar. 1985, pp. 19–20.

*Primary Examiner*—Michael C. Wimer
*Assistant Examiner*—Peter Toby Brown

[57] ABSTRACT

An antenna (10) is described comprising a generally elongate, magnetically permeable core (12) having a major axis, an insulating substrate (20) being affixed to the core (12) along an axis parallel to the major axis, and having at least a pair of opposed spaced conductive runners (21) positioned along the substrate normal to said major axis. A plurality of charge storage devices (16) are secured between the pair of opposed spaced conductive runners (21). An electrically conductive split sleeve (14) is positioned surrounding the core (12), and has first and second edge portions in electrical connection with the pair of opposed spaced conductive runners (21) opposite said charge storage devices (16). Arrangements for mechanically mounting the antenna (10) are provided which are integral to the antenna (10). The mechanical mounting arrangements are separate from the arrangements provided for electrically connecting the antenna 10 to the receiver.

17 Claims, 9 Drawing Sheets

SINGLE TURN FERRITE ROD ANTENNA WITH MOUNTING STRUCTURE

BACKGROUND OF THE INVENTION

The present invention relates, in general, to a single turn ferrite rod antenna and method. More particularly, the present invention relates to an antenna and method resulting in a high "Q", high sensitivity antenna suitable for use in conjunction with miniaturized receivers.

Requirements for decreased size of paging and radio receiver packages have necessitated simplification and down-sizing of antenna elements to meet manufacturing and size constraints. However, the antenna must, nevertheless, provide a sufficiently high "Q" (low loss) while simultaneously exhibiting sufficient radiated signal sensitivity. Existing technologies have been unsatisfactory in meeting these constraints.

U.S. Pat. No. 3,267,478 issued to Schiefer on Aug. 16, 1966, and U.S. Pat. No. 3,594,805 issued to Chardin on Jul. 20, 1971 describe tunable ferromagnetic rod loop antennas comprising a cylindrical core surrounded by a sleeve of electrically conductive material. A gap was provided running the entire length of the sleeve and included a plurality of capacitors distributed and spaced equidistantly throughout the length. A coupling winding surrounded at least a portion of the core of the Schiefer antenna and included a pair of wires for coupling the antenna assembly to the receiver. A second split sleeve was positioned over the first sleeve of the Chardin antenna to adjust the inductance of the assembly by masking portions of a second longitudinal slot on the first sleeve. Neither antenna provided a means for readily mounting the antenna to a printed circuit board. As a consequence, such an antenna is not suitable for use with today's advanced manufacturing processes, such as surface mount technologies and automated assembly techniques.

U.S. Pat. No. 4,814,782 issued to Chai Mar. 21, 1989 and assigned to the assignee of the present invention, described an antenna having a structure somewhat similar to that described by Schiefer, but having provision for mounting the antenna to a printed circuit board. In particular, the sleeve further included integral mounting tabs for securing the antenna assembly to the printed circuit board while establishing electrical connection to the antenna without the use of wire leads. Such an antenna as described by Chai provided a significant improvement over the prior art in both construction and mounting. However, because the mechanical connections and the electrical connections were in common, reduced antenna performance could occur during extreme shock and/or drop conditions due to large stresses being placed on the mounting tabs.

It would therefore be highly desirable to provide an expedient structure for and method of mounting and electrically connecting the antenna to a printed circuit board which would provide improved mechanical mounting of the ferrite core loop antenna to withstand even more extreme environmental influences, such as higher mechanical shock levels, without the use of extraneous mounting hardware.

SUMMARY OF THE INVENTION

An antenna in accordance with the present invention is described having provision for mounting the antenna to a printed circuit board. The antenna comprises a generally elongate, magnetically permeable core having a major axis, and includes an integral mounting arrangement for mounting the antenna to the printed circuit board. An insulating substrate, affixed to the core along an axis parallel to the major axis, has at least a pair of opposed spaced conductive runners positioned along the substrate normal to said major axis. A plurality of charge storage devices are secured between the pair of opposed spaced conductive runners. An electrically conductive split sleeve is positioned surrounding the core and has first and second edge portions in electrical connection with the pair of opposed spaced conductive runners opposite the charge storage devices. Contact tabs are coupled to the conductive runners for providing separate electrical contact for the antenna to the printed circuit board.

An alternate embodiment of the antenna in accordance with the present invention is also described. The antenna comprises a generally elongate, magnetically permeable core having a major axis. An insulating substrate is affixed to the core along an axis parallel to the major axis and has a pair of opposed spaced conductive runners positioned along the substrate normal to the major axis, and further includes contacts coupled to the conductive runners for providing electrical connection to the antenna. A plurality of charge storage devices are secured between the pair of opposed spaced conductive runners. An electrically conductive split sleeve is positioned surrounding the core and has first and second edge portions in electrical connection with the pair of opposed spaced conductive runners opposite the charge storage devices. A mounting arrangement, separate from the electrical connections and integral to the antenna, is provided for mounting the antenna to the printed circuit board.

An alternate embodiment of the antenna in accordance with the present invention is also described for mechanically mounting the antenna to a housing. The antenna comprises a generally elongate, magnetically permeable core having a major axis, and including mounting means, integrally formed as a part of the core for providing mechanical mounting of the antenna to the housing. An insulating substrate is affixed to the core along an axis parallel to the major axis, the insulating substrate having a pair of opposed spaced conductive runners positioned along the substrate normal to the major axis, and includes contact means coupled to the conductive runners for providing an electrical connection between the antenna and the receiver located on the printed circuit board. A plurality of charge storage devices are secured between the pair of opposed spaced conductive runners, and an electrically conductive split sleeve positioned surrounding the core, the sleeve having first and second edge portions in electrical connection with the pair of opposed spaced conductive runners opposite the charge storage devices.

DESCRIPTION OF A PREFERRED EMBODIMENT

Figure 1A:
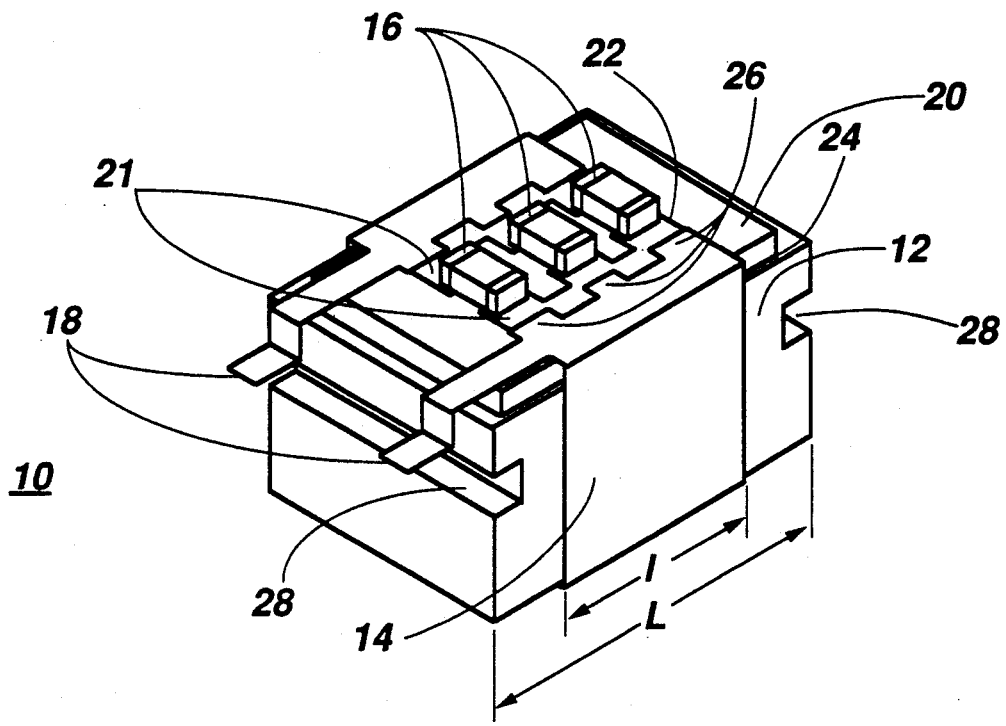
FIG. 1A presents a perspective view of a first embodiment of a single turn ferrite rod antenna in accordance with the present invention.
Figure 1B:
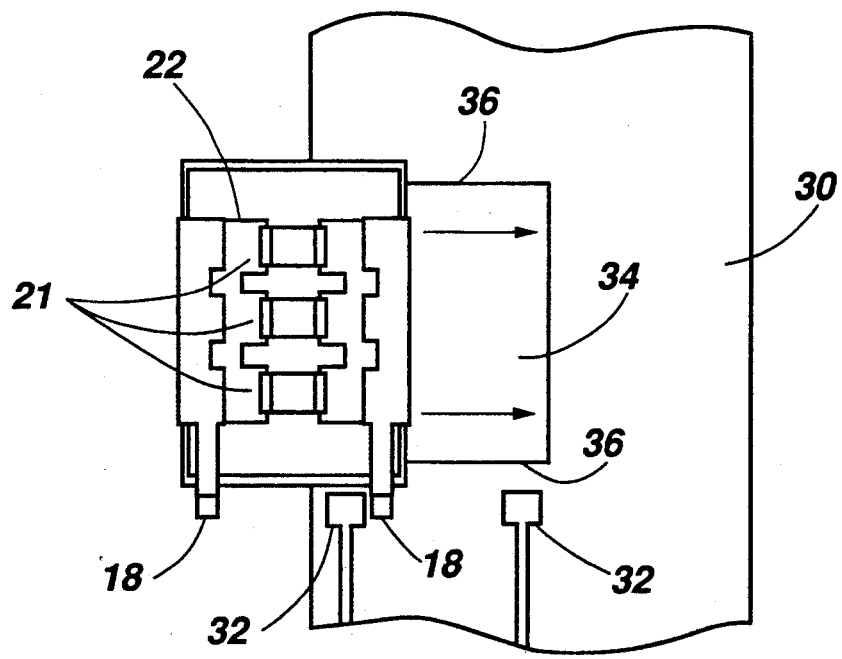
FIG. 1B presents a top plan view of a portion of a printed circuit board illustrating the mounting of the first embodiment of the single turn ferrite rod antenna in accordance with the present invention.

With reference to FIGS. 1A and 1B, a single turn ferrite rod antenna 10 in accordance with a first embodiment of the present invention is shown. The single turn ferrite rod antenna 10 comprises a ferrite rod 12 having a surrounding single turn conductive sleeve 14. As illustrated in FIG. 1A, the ferrite rod 12 includes a major axis of length "L" while the single turn sleeve 14 has a length "l" typically less than or equal to length "L" along a parallel axis. The single turn ferrite rod antenna 10 has preferably a generally rectangular cross section as shown, although any other suitable geometric configurations, such as square or circular with a flat surface extending along an axis parallel to the major axis is suitable as well. The ferrite rod is formed from any of a number of well known ferrite materials suitable for antenna construction. The single turn sleeve 14 is preferably made of copper or beryllium copper, and is preferably plated, such as with tin, or tin over nickel over copper, to provide resistance to environmental conditions and to provide solderability.

Figure 2A:
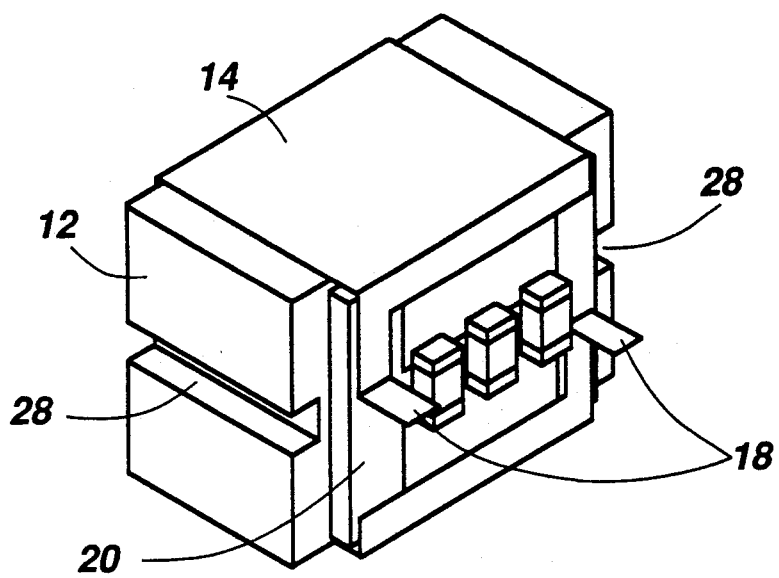
FIG. 2A presents a perspective view of a second embodiment of a single turn ferrite rod antenna in accordance with the present invention.

The single turn ferrite rod antenna 10 further includes a number of capacitors 16, which function as charge storage devices, affixed to an insulating substrate 20, such as a printed circuit board. The capacitors 16 are preferably discrete fixed surface mount chip capacitors of generally equal capacitance aligned along an axis parallel to the major axis of the ferrite rod 12 and uniformly distributed along length "l". The mounting substrate 20 can include corresponding pairs of opposed conductive runners 21, as shown in FIG. 1B, on the chip mounting surface 22 to which the capacitors 16 are electrically connected by an attachment process such as soldering. It will also be appreciated that the opposed conductive runners can also be formed from two opposed continuous runners, as shown in FIG. 2A, to which the capacitors are soldered. In this case, a solder mask is generally employed to improve the soldering of the capacitors to the runners. Returning to FIG. 1A, the mounting substrate 20 further includes an undersurface 24 which is preferably glued or otherwise secured to ferrite rod 12. The single turn sleeve 14 can further include a number of pairs of opposed digitated solder tabs 26 which adjoin to the mounting substrate 20 at chip mounting surface 22. In this manner, the preformed single turn sleeve 14 is electrically connected by soldering to the conductive runners 21 on chip mounting surface 22 of printed circuit board 20 for establishing electrical contact between pairs of opposed digitated tabs 26 and the corresponding capacitors 16. The single turn ferrite rod antenna 10 is provided with a pair of connecting tabs 18 which provide electrical connection between the receiver and the single turn ferrite rod antenna 10, as will be described further in FIG. 1B. A pair of grooves 28 which are located at opposite ends and integral to the ferrite rod 12, and which lie along an axis substantially parallel to the surface to which the mounting substrate 20 is affixed are provided to provide mechanical mounting and support of the single turn ferrite rod antenna 10. The grooves 28 are preferably formed during the ferrite rod forming process which is well known in the art, and are suitably formed to engage the printed circuit board containing the receiver as will be described below.

FIG. 1B shows a top plan view showing the assembly of the single turn ferrite rod antenna 10 with a circuit board 30 which contains the receiver, and which provides mounting and establishes electrical connection to the single turn ferrite rod antenna 10. As shown in FIG. 1A, the single turn ferrite rod antenna 10 incorporates contact tabs 18 which are integral with the single turn sleeve 14 and which extend along the major axis outwardly from surface 22 to provide electrical connection to solder pads 32 located on a common surface of the circuit board 30. The single turn ferrite rod antenna 10 is attached by sliding the ferrite rod 12 into an opening 34 of the circuit board 30, as shown. The circuit board 30 engages the grooves 28 at opening 34. The opening 34 may have the sides 36 tapered slightly so as to provide a more positive engagement between the ferrite rod 12 and the circuit board 30, and to absorb tolerances in the forming of the ferrite rod 12 and the opening 34. The mounting arrangement described not only provides a rigid support for the antenna, but eliminates lead wires for establishing electrical connection between the single turn ferrite rod antenna 10 and the subsequent circuitry. In order to minimize the space required beneath the circuit board 30 for mounting the single turn ferrite rod antenna 10, the grooves 28, as shown in FIG. 1A, are offset about the midline of the ferrite core 12 so as to minimize the protrusion of the ferrite rod 12 through the circuit board 30.

Figure 2B:
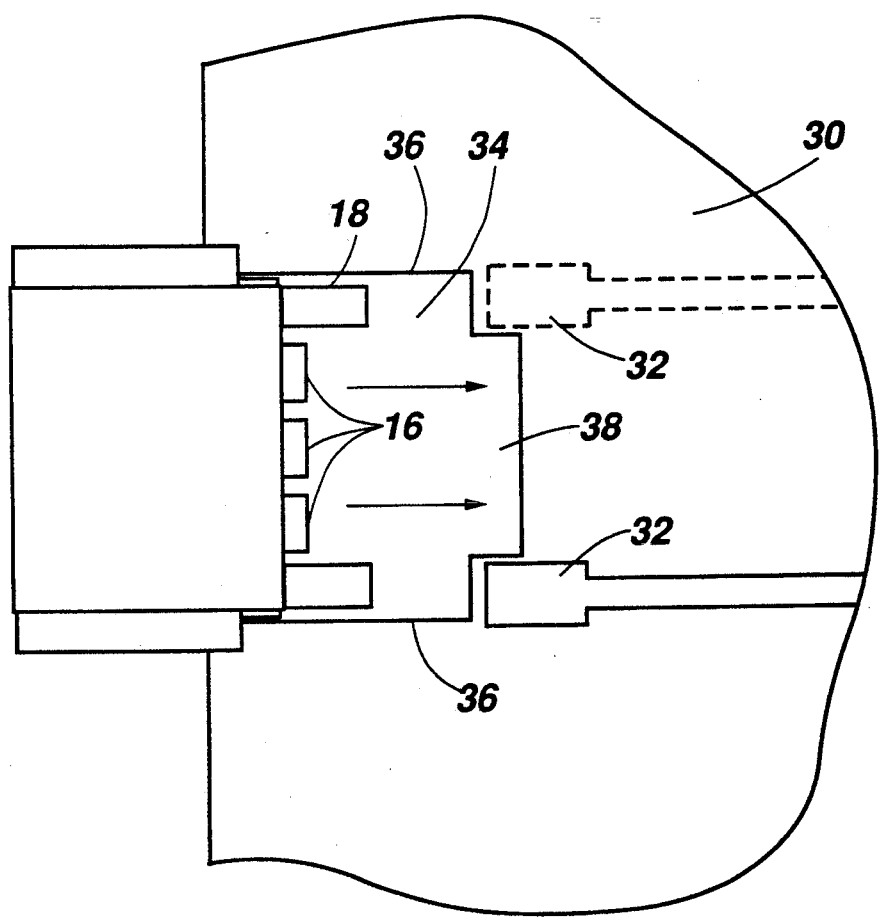
FIG. 2B presents a top plan view of a portion of a printed circuit board illustrating the mounting of the second embodiment of the single turn ferrite rod antenna in accordance with the present invention.

A second embodiment of the single turn ferrite rod antenna 10 in accordance with the present invention is shown in FIGS. 2A and 2B. As shown in FIG. 2A, the grooves 28 which are utilized for mounting are also integrally formed substantially perpendicular to the surface to which the mounting substrate 20 is affixed on the ferrite rod 12 as previously described. While the grooves 28 are shown about an axis perpendicular to the mounting surface and substantially about the midline of the ferrite rod 12, it will be appreciated that the grooves 28 can also be offset as described above, so as to minimize the protrusion through the circuit board 30. A pair of contact tabs 18 are formed contiguously from the single turn conductive sleeve 14 to provide electrical connection with the circuit board 30, which as shown in FIG. 2B can also provide electrical connection to both the top and bottom surfaces of the circuit board 30. It will be appreciated, by properly forming the contact tabs 18, connection to a single surface of the circuit board 30 can be provided as well.

As shown in FIG. 2B, the single turn ferrite rod antenna 10 engages the circuit board 30 in a manner as described in FIG. 1B, wherein the pair of integral grooves 28 engage the circuit board 30 in a sliding fashion within opening 34. An additional opening 38 is provided to provide clearance between the circuit board 30 and the chip capacitors 16. The opening 34 within the circuit board 30 may have the sides 36 tapered slightly so as to provide a positive engagement between the ferrite rod 12 and the circuit board 30.

Figure 3A:
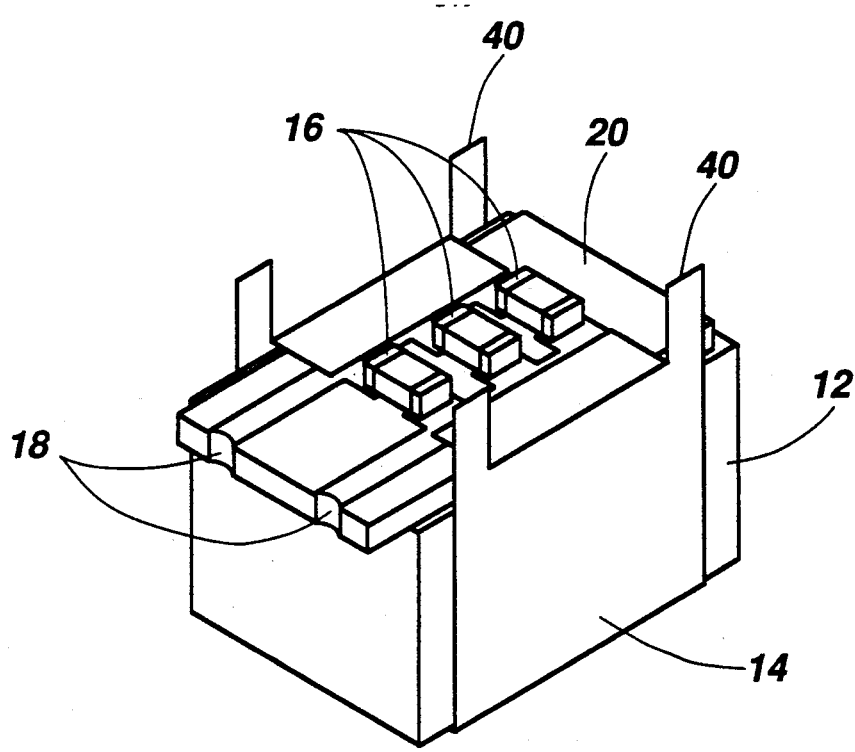
FIG. 3A presents a perspective view of a third embodiment of a single turn ferrite rod antenna in accordance with the present invention.
Figure 3B:
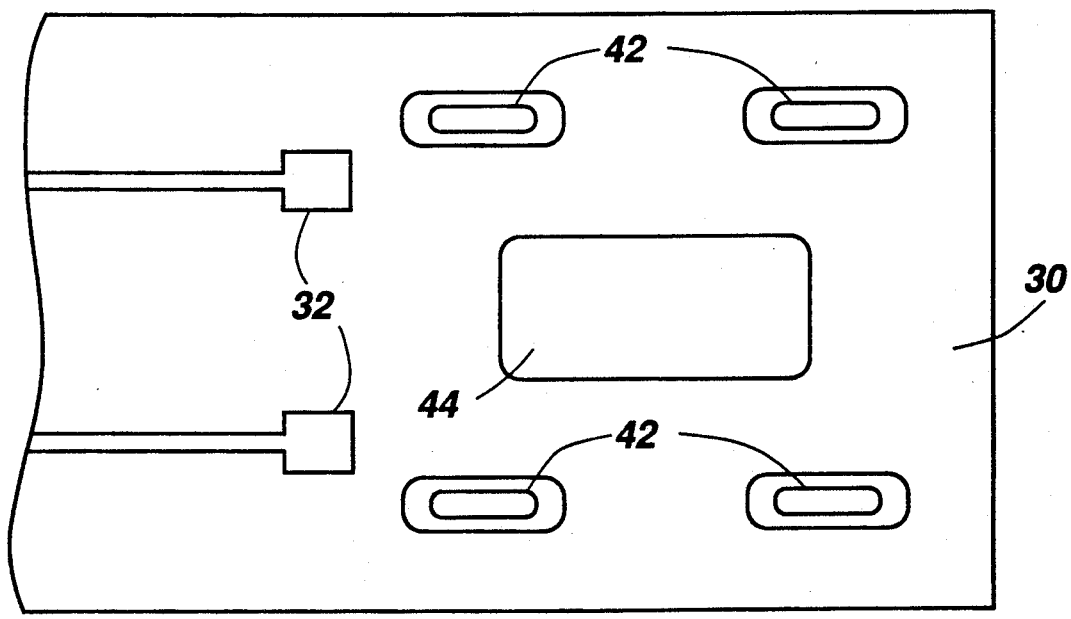
FIG. 3B presents a top plan view of a portion of a printed circuit board illustrating the mounting of the third embodiment of the single turn ferrite rod antenna in accordance with the present invention.

FIGS. 3A and 3B show a third embodiment of the single turn ferrite rod antenna 10 in accordance with the present invention. As shown in FIG. 3A, the mounting substrate 20 is elongated along the major axis of the ferrite rod 12, so as to provide contact tabs 18 which are integral to the mounting substrate. The mounting substrate 20 is preferably a printed circuit board, and the electrical connections are provided by contact tabs 18 which are preferably formed during the processing of the printed circuit board. The printed circuit pattern provides the necessary electrical connection between the single turn conductive sleeve 14 and the chip capacitors 16. Mechanical connection to the single turn ferrite rod antenna 10 is provided by means of mounting tabs 40 which are contiguously formed from the single turn conductive sleeve 14. The mounting tabs 40 engage slots 42, such as formed by plated-thru holes in circuit board 30, as shown in FIG. 3B. An aperture 44 within the circuit board 30 provides clearance for the components mounted on the printed circuit board 20. In particular, aperture 44 allows the protrusion of the distributed chip capacitors 16. The single turn ferrite rod antenna 10 is mounted to the circuit board 30 by insertion of the mechanical mounting tabs 40 through the slots 42 in the circuit board 30. The mounting tabs can be formed so as to provide a snap-in connection, locking the antenna 10 to the circuit board 30 during the remainder of the circuit board 30 processing operations. The arrangement described above enables the single turn ferrite rod antenna 10 to be mounted to the circuit board automatically using automatic assembly techniques, such as pick and place robots. The electrical connection is established between the contact tabs 18 and the solder pads 32 located on a common surface of the circuit board 30. During the soldering process, the mounting tabs 40 are soldered to the slots 42 to provide the primary mechanical attachment to the printed circuit board 30. The mechanical attachment is separate from the electrical connection to the antenna 10.

Figure 4A:
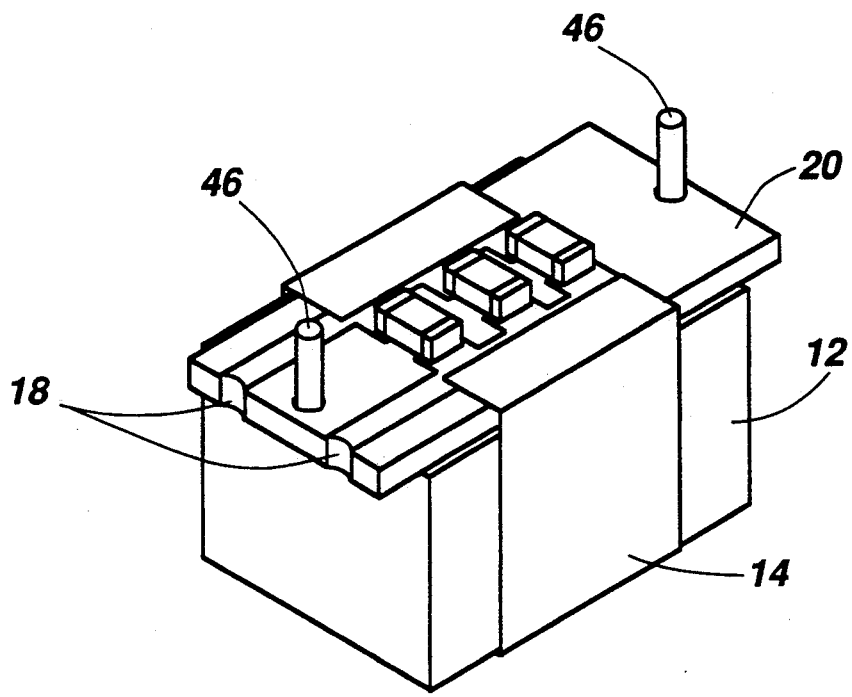
FIG. 4A presents a perspective view of a fourth embodiment of a single turn ferrite rod antenna in accordance with the present invention.
Figure 4B:
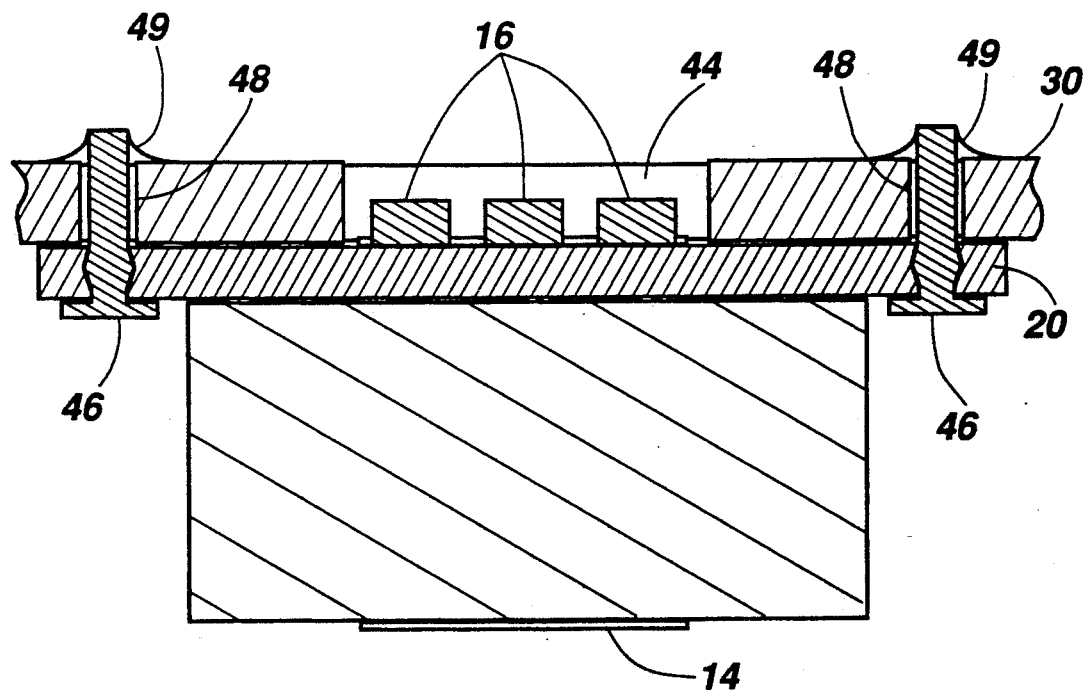
FIG. 4B presents a side cross-section of a portion of a printed circuit board illustrating the mounting of the fourth embodiment of the single turn ferrite rod antenna in accordance with the present invention.

A fourth embodiment in accordance with the present invention is shown in FIGS. 4A and 4B. As shown in FIG. 4A, the mounting substrate 20 is elongated along the major axis of the ferrite rod 12, to provide contact tabs 18 which are integral to the mounting substrate, and to provide a mounting surface for at least one mechanical mounting post 46, and as shown for example in FIG. 4A as two mechanical mounting posts 46. The mechanical mounting posts 46, such as solder posts, are preferably press fit into the mounting substrate 20, as shown in FIG. 4B, although it will be appreciated that other forms of attaching the mounting posts 46 to the mounting substrate 20, such as by soldering, may be utilized as well. Returning to FIG. 4A, the mounting substrate 20 is preferably a printed circuit board, and the contact tabs 18 are preferably formed during the processing of the printed circuit board. The printed circuit board also provides the necessary electrical connection between the single turn sleeve 14 and the chip capacitors 16. As shown in FIG. 4B, an aperture 44 within the circuit board 30 provides clearance for the components mounted on the mounting substrate 20. In particular, aperture 44 allows the protrusion of the distributed chip capacitors 16. The single turn ferrite rod antenna 10 is mounted to the circuit board 30 by insertion of the mechanical mounting posts 46 through the holes 48, which are preferably plated-thru holes. The arrangement described above enables the single turn ferrite rod antenna 10 to be mounted to the circuit board automatically using automatic assembly techniques, such as pick and place robots. The electrical connection is established between the contact tabs 18 and the solder pads on the circuit board 30, as described above. During the soldering process, a solder fillet 49 is formed soldering the mechanical contact posts 46 to the plated-thru holes 48 to provide the required mechanical strength. It will be appreciated that other attachment processes, such as heat staking when the mechanical mounting post is formed from a plastic material may be utilized as well.

Figure 5A:
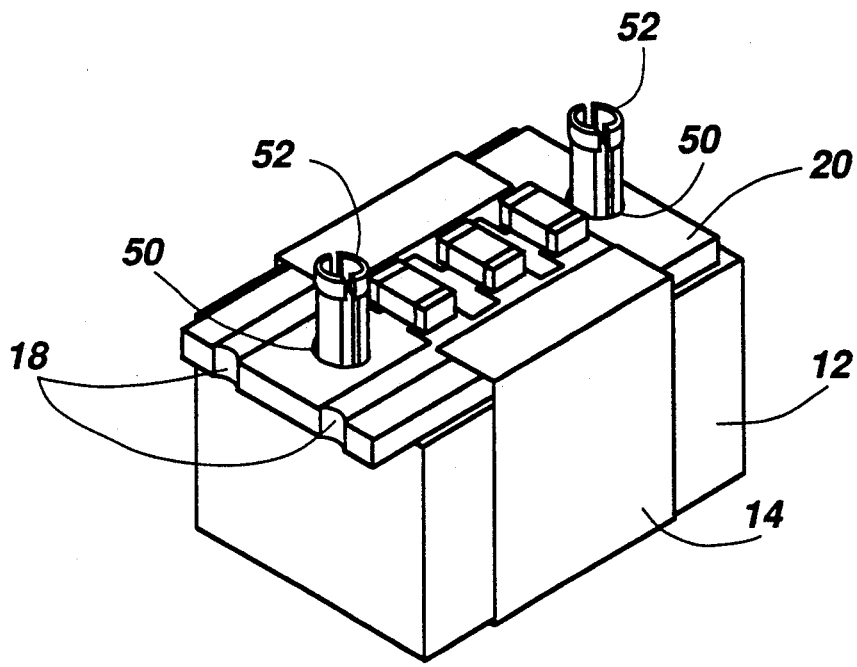
FIG. 5A presents a perspective view of a fifth embodiment of a single turn ferrite rod antenna in accordance with the present invention.
Figure 5B:
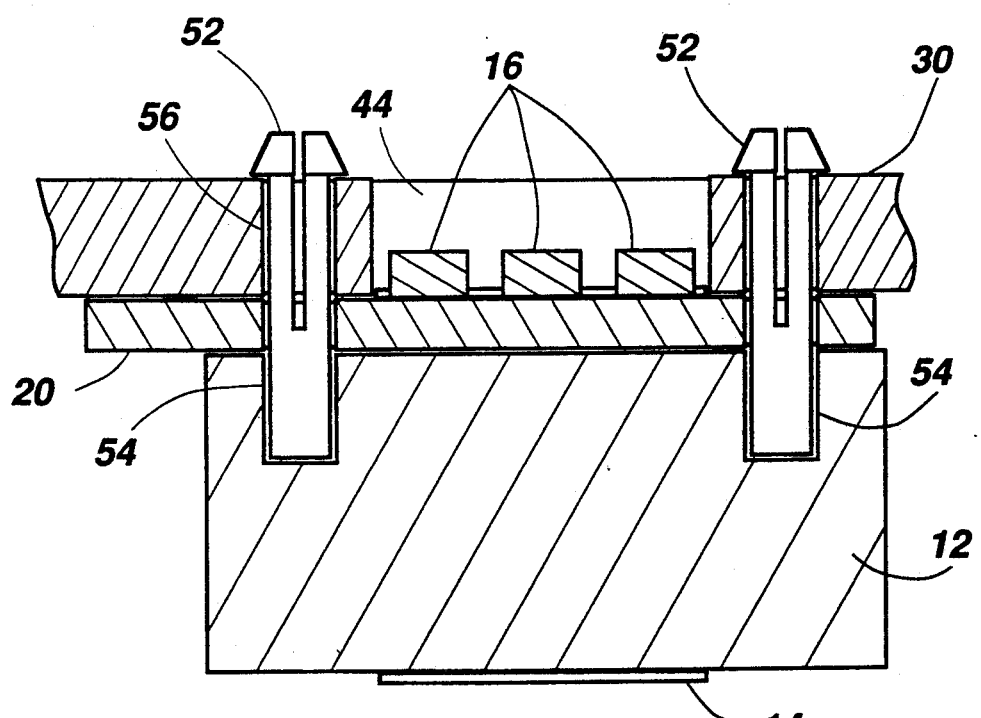
FIG. 5B presents a side cross-sectional view of a portion of a printed circuit board illustrating the mounting of the fifth embodiment of the single turn ferrite rod antenna in accordance with the present invention.

A fifth embodiment in accordance with the present invention is shown in FIGS. 5A and 5B. As shown in FIG. 5A, the mounting substrate 20 is elongated along the major axis of the ferrite rod 12, so as to provide contact tabs which are integral to the mounting substrate. One or more clearance holes 50 are provided within the mounting substrate 20 to provide clearance for one or more mechanical mounting posts 52, which are shown for example in FIG. 5A as two mechanical mounting posts 52. The mechanical mounting posts 52 are preferably molded from a plastic material, such as VECTRA ® C130 Liquid Crystal Polymer manufactured by Hoechst Celanese Corp., which can be subjected to high temperatures, such as encountered during reflow soldering. The mechanical mounting posts 52 are held into cavities 54, as shown in FIG. 5B, which are preferably formed in the ferrite rod 12 during manufacture. The mechanical mounting posts 52 are held in the ferrite rod 12 using mounting techniques such as swaging, ultrasonic bonding, or adhesive bonding, such as with an epoxy adhesive. Returning to FIG. 5A, the mounting substrate 20 is preferably a printed circuit board, and the contact tabs 28 are preferably formed during the processing of the printed circuit board. The printed circuit board also provides the necessary electrical connection between the single turn sleeve 14 and the chip capacitors 16. As shown in FIG. 5B, an aperture 44 within the circuit board 30 provides clearance for the components mounted on the mounting substrate 20. In particular, aperture 44 allows the protrusion of the distributed chip capacitors 16. The single turn ferrite rod antenna 10 is mounted to the circuit board 30 by insertion of the mechanical mounting posts 52 through the mounting holes 56, which are preferably not plated-thru holes, in the circuit board 30. The mechanical mounting posts are formed so as to be compressed while being pressed into the mounting holes 56, thereby retaining the single turn ferrite rod antenna 10 to the circuit board 30. This arrangement also enables the single turn ferrite rod antenna 10 to be mounted to the circuit board automatically using automatic assembly techniques, such as pick and place robots. The electrical connection is established between the contact tabs 18 and the solder pads on the circuit board 30, as described above.

Figure 6A:
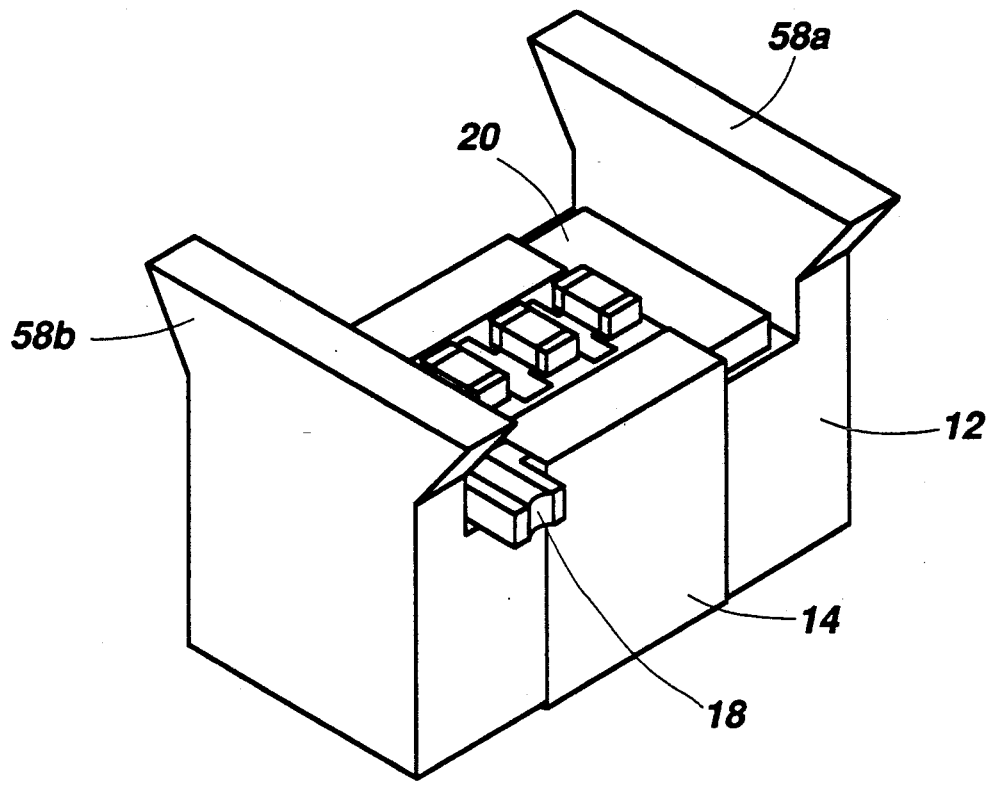
FIG. 6A presents a perspective view of a sixth embodiment of a single turn ferrite rod antenna in accordance with the present invention.
Figure 6B:
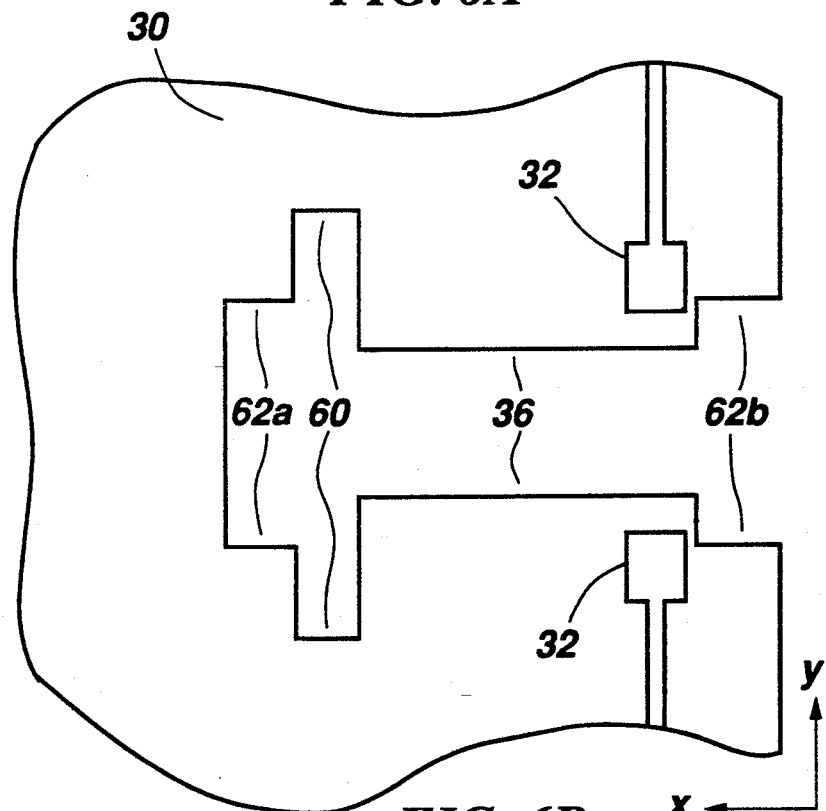
FIG. 6B presents a top plan view of a portion of a printed circuit board illustrating the mounting of the sixth embodiment of the single turn ferrite rod antenna in accordance with the present invention.

A sixth embodiment of the single turn ferrite rod antenna 10 in accordance with the present invention is shown in FIGS. 6A and 6B. At least one mounting flange 58 is integrally formed as a part of the ferrite rod 12 during manufacture. As shown for example in FIG. 6A, two mounting flanges 58 are preferably utilized. The mounting flanges extend above the surface to which the mounting substrate 20 is affixed and are substantially perpendicular to the major axis of the ferrite rod 12. It will be appreciated other orientations of the mounting flanges are possible for securing the ferrite rod, as well. A pair of contact tabs 18, one of which is shown, are formed by extending the width of the mounting substrate 20, so as to provide contact tabs 18 which are integral to the mounting substrate. The mounting substrate 20 is preferably a printed circuit board, and the contact tabs 18 are preferably formed during the processing of the printed circuit board. The printed circuit board also provides the necessary electrical connection between the single turn conductive sleeve 14 and the chip capacitors 16, and which as shown in FIG. 6B can provide electrical connection to a single side of the circuit board 30.

As further shown in FIG. 6B, the single turn ferrite rod antenna 10 is engaged in the circuit board 30 by inserting in a "Z" axis direction mounting flange 58A within the aperture 60, and then by sliding the ferrite rod 12 in the "X" axis direction thereby engaging the circuit board 30 with the mounting flanges 58A and 58B along the edges of the apertures 62A and 62B. An additional opening 36 is provided to provide clearance between the circuit board 30 and the chip capacitors 16. The opening 62A within the circuit board 30 may have the sides tapered slightly so as to provide a positive engagement between the ferrite rod 12 and the circuit board 30. Tolerances in the thickness of the circuit board 30 are absorbed by the wedge shaped geometry of the mounting flanges 58.

Figure 6C:
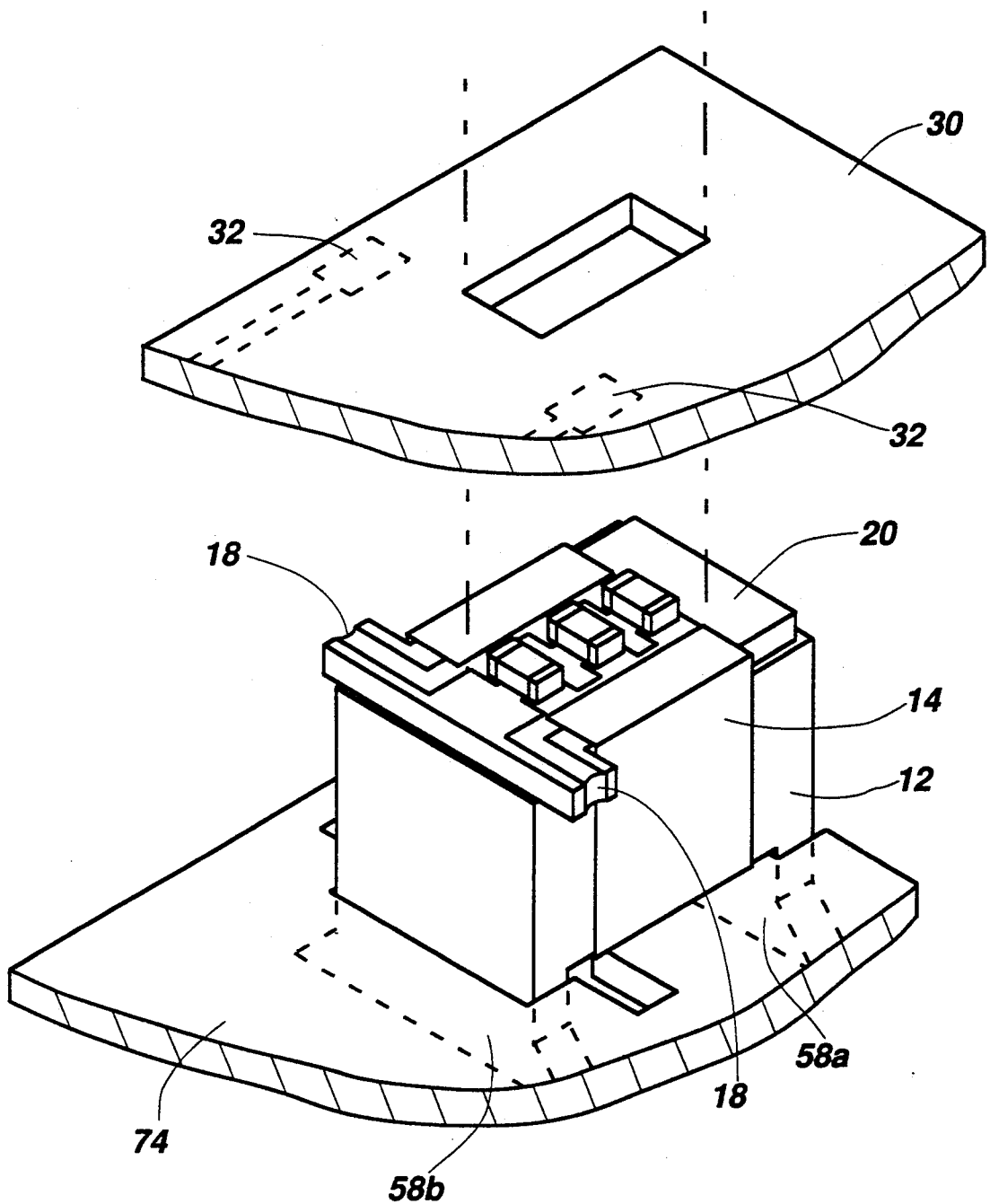
FIG. 6C presents a top plan view of a portion of first and second printed circuit boards illustrating the mounting of the single turn ferrite loop antenna in accordance with the present invention.

The mounting flanges 58 can also be utilized to provide mechanical mounting to a second printed circuit board 74 as shown in FIG. 6C, such as is common in many selective call receivers which utilize a first printed circuit board for such functions as receiver functions, and a second printed circuit board for such functions as decoding and display functions. When two printed circuit boards are utilized as described, the boards are stacked one on top of the other, with a suitable interconnect provided to pass signals between the two boards. When the mounting flanges 58 are utilized to mount the single turn ferrite rod antenna 10 to a second printed circuit board 74, the flanges 58 engage an opening in the second printed circuit board 74, as described in the single board mounting embodiment of FIGS. 6A and 6B. However, in this embodiment, the insulating substrate 20 is then arranged on the ferrite rod opposite the flanges 58 shown in FIG. 6A. When the first printed circuit board 30 is then interconnected to the second printed circuit board 74 mechanically supporting the antenna 10, electrical connection between the first printed circuit board 30 and the antenna 10 is provided as also described in FIG. 7A, to be described below. By providing separate mechanical mounting to the second printed circuit board 74, the stress on the electrical connections (46, 64) provided to the first printed circuit board 30 is minimized.

Figure 7A:
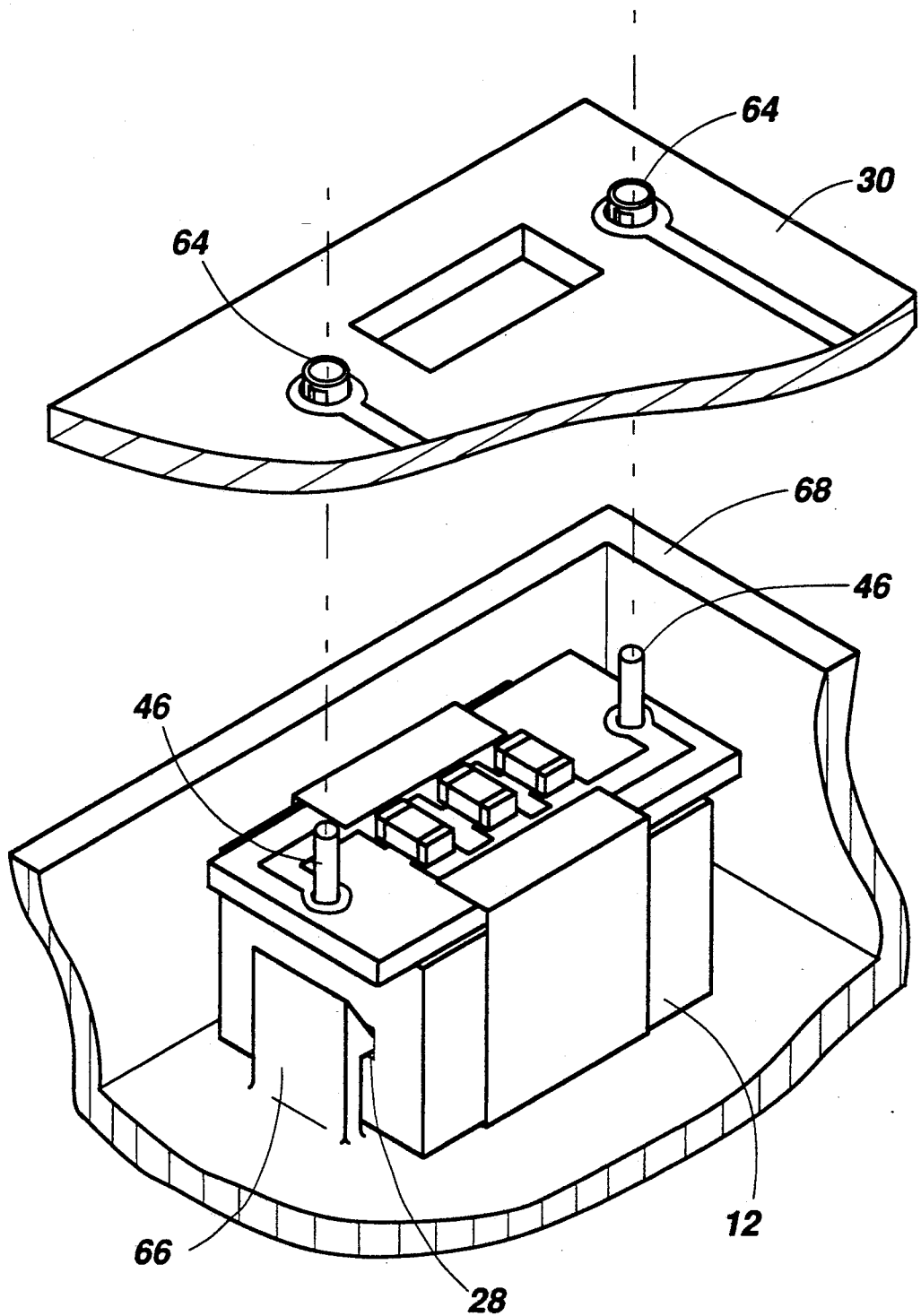
FIGS. 7A and 7B present perspective views of a seventh embodiment of a single turn ferrite loop in accordance with the present invention.
Figure 7B:
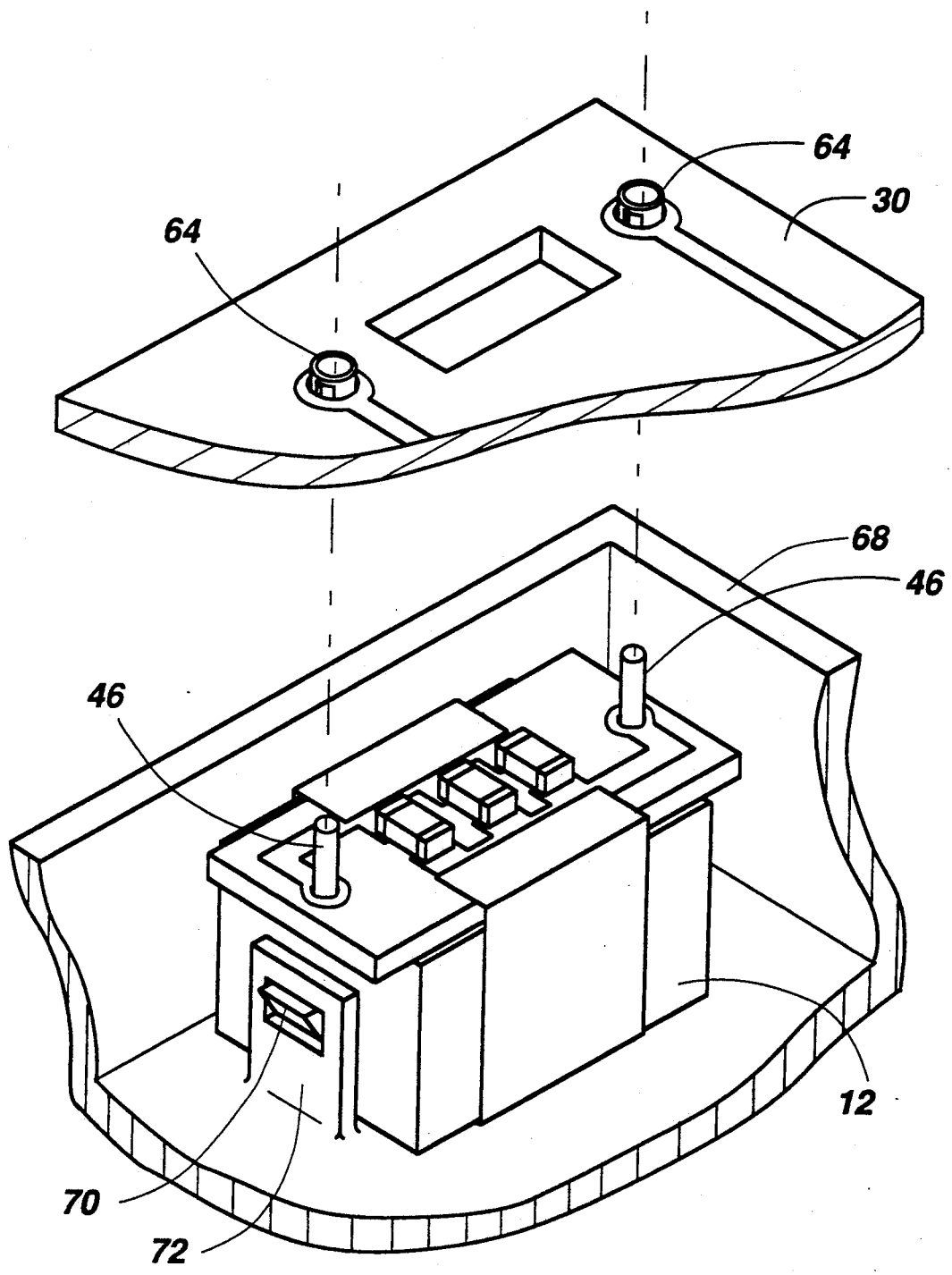

FIGS. 7A and 7B are perspective views of a seventh embodiment of a single turn ferrite loop in accordance with the present invention. In particular, FIG. 7A shows the mounting of the single turn ferrite loop antenna 10 to a housing 68, shown in a partial cutaway view. The ferrite rod 12 includes at least a pair of grooves 28 (one of which is shown) which are integrally molded into the opposite ends of the ferrite rod 12 to provide mechanical support of the single turn ferrite loop antenna 10 to the housing 68. In the embodiment shown in FIG. 7A, the grooves 28 form a recess terminated within each end of ferrite rod 12 to enable locating and securely fastening the single turn ferrite loop antenna 10 to the housing 68, when engaged by at least a pair of mounting supports 66, only one of which is shown. The mounting supports 66 are preferably integrally molded as a part of the housing, and are flexible so as to be outwardly flexed when the single turn ferrite loop antenna 10 is mounted. When the mounting supports 66 engage the grooves 28, the mounting supports 66 return to the normal un-flexed condition to provide positive mounting and positioning of the single turn ferrite loop antenna 10 to the housing 68. After the single turn ferrite loop antenna 10 has been mounted securely to the housing 68, the printed circuit board 30 which supports the receiver circuitry is electrically coupled to the single turn ferrite loop antenna 10 by positioning the printed circuit board 30 over the antenna 10, and engaging the electrical contact posts 46, preferably to electrical contacts such as sockets 64 soldered or clinched into the printed circuit board 30. It will be appreciated that other forms of electrical connection, such as by directly soldering the electrical contact posts 46 to the printed circuit board 30, may be utilized as well.

FIG. 7B shows an alternate method of providing the mechanical mounting of the single turn ferrite loop antenna 10 with the housing 68. In the place of the grooves 28 which are integrally molded into the opposite ends of the ferrite rod 12, at least a pair of mounting flanges 70 (one of which is shown), are also integrally molded into the ferrite rod 12. As described above, the mounting flanges 70 form a protrusion terminated within each end of ferrite rod 12 to enable locating and securely fastening the single turn ferrite loop antenna 10 to the housing 68, when engaged by at least a pair of mounting supports 72, only one of which is shown. As described above, the mounting supports 72 are preferably integrally molded as a part of the housing, and are flexible so as to be outwardly flexed when the single turn ferrite loop antenna 10 is mounted. When the mounting supports 72 engage the mounting flanges 70, the mounting supports 72 return to the normal un-flexed condition to provide positive mounting and positioning of the single turn ferrite loop antenna 10 to the housing 68. In summary, in the seventh embodiment of the single turn ferrite loop 10 in accordance with the present invention, mechanical mounting of the antenna is provided to the housing and is independent of the electrical connection between the antenna 10 and the printed circuit board 30 as described above. In this manner, the mechanical stresses normally associated with mounting the antenna 10 to the printed circuit board 30 are minimized by securely fastening the antenna 10 to the housing 68.

The representative electrical performance of the single turn ferrite rod antenna 10 is described in detail in U.S. Pat. No. 4,814,782 issued Mar. 21, 1989 to Chai, and which is assigned to the assignee of the present invention, and which is hereby incorporated by reference herein.

In summary, a single turn ferrite rod antenna 10 has been shown and described which provides separate means for electrical connection and mechanical support of the antenna. The electrical connections are advantageously provided in one of a plurality of ways, such as with contact tabs or pins integral to the insulating substrate used to mount the distributed capacitors, thereby providing a reflowable solder connection to a single surface of the printed circuit board; or with contact tabs or pins which are integral to the single turn conductive sleeve, thereby providing connection to either single or multiple surfaces of the printed circuit board. The mechanical mounting is provided advantageously in one of a plurality of ways, such as by grooves integrally formed as a part of the ferrite rod, by mounting tabs integrally formed as a part of the single turn conductive sleeve, by mounting posts integrally attached to the mounting substrate or to the ferrite core, or by flanges or bosses integrally formed as part of the ferrite rod. In this manner, improved reliability is gained when the receiver is subjected to a mechanical stress, such as shock, which can be induced when the receiver is dropped, since considerably less stress is placed on the electrical connections to the receiver circuit board. The single turn ferrite rod antenna 10, because it is not permanently affixed to the printed circuit board 30, can also be readily replaced should it ever become necessary.

What we claim is:

1. An antenna assembly comprising:
    a first printed circuit board and an antenna, said antenna comprising:
    a generally elongate, magnetically permeable core having a major axis, and including integral mounting means comprising one or more grooves integrally formed as part of said core for mounting the antenna to the printed circuit board;
    an insulating substrate being affixed to said core along an axis parallel to said major axis, said insulating substrate having at least a pair of opposed spaced conductive runners positioned along said substrate parallel to said major axis;
    a plurality of charge storage devices secured between said pair of opposed spaced conductive runners;
    an electrically conductive split sleeve positioned surrounding said core, said sleeve having first and second edge portions in electrical connection with said pair of opposed spaced conductive runners opposite said charge storage devices; and
    means coupled to said conductive runners for providing electrical contact separate from said mounting means, for coupling the antenna to the printed circuit board.

2. The antenna assembly of claim 1 wherein said core is a ferrite rod.

3. The antenna assembly of claim 1 wherein said charge storage devices are fixed value, discrete capacitors.

4. The antenna assembly of claim 1 wherein said split sleeve comprises a generally elongate band.

5. The antenna assembly of claim 1 wherein said insulating substrate further includes contact means coupled to said conductive runners for providing electrical connection between the antenna and the printed circuit board.

6. The antenna assembly of claim 1 wherein said means for providing electrical contact comprises at least two contact tabs integral to said electrically conductive split sleeve and coupled to said conductive runners for providing separate electrical contact for the antenna to the printed circuit board.

7. An antenna assembly comprising:
    a first printed circuit board, a second printed circuit board and an antenna, said antenna comprising:
    a generally elongate, magnetically permeable core having a major axis;
    an insulating substrate being affixed to said core along an axis parallel to said major axis, said insulating substrate having a pair of opposed spaced conductive runners positioned along said substrate parallel to said major axis, and further including contact means coupled to said conductive runners for providing electrical connection between the antenna and the second printed circuit board;
    a plurality of charge storage devices secured between said pair of opposed spaced conductive runners;
    an electrically conductive split sleeve positioned surrounding said core, said sleeve having first and second edge portions in electrical connection with said pair of opposed spaced conductive runners opposite said charge storage devices; and
    mounting means, integral to the antenna, for mounting the antenna to said first printed circuit board which is separate from the second printed circuit board to which the electrical connection to the antenna is provided.

8. The antenna assembly of claim 7 wherein said core is a ferrite rod.

9. The antenna assembly of claim 7 wherein said charge storage devices are fixed value, discrete capacitors.

10. The antenna assembly of claim 7 wherein said split sleeve comprises a generally elongate band.

11. An antenna assembly comprising:
    a single turn ferrite loop antenna and a housing which encloses a printed circuit board supporting a receiver, said antenna comprising:
    a generally elongate, magnetically permeable core having a major axis, said core including mounting means, integrally formed as part of said core for providing mechanical mounting of the antenna to the housing;
    an insulating substrate being affixed to said core along an axis parallel to said major axis, said insulating substrate having a pair of opposed spaced conductive runners positioned along said substrate parallel to said major axis, and further including contact means, coupled to said conductive runners, for providing an electrical connection between the antenna and the printed circuit board;

a plurality of charge storage devices secured between said pair of opposed spaced conductive runners; and an electrically conductive split sleeve positioned surrounding said core, said sleeve having first and second edge portions in electrical connection with said pair of opposed spaced conductive runners opposite said charge storage devices.

12. The antenna assembly of claim 11, wherein said mounting means comprises one or more flanges integrally molded into said core, for providing mechanical mounting to the housing.

13. The antenna assembly of claim 11, wherein said mounting means comprises one or more grooves integrally molded into said core, for providing mechanical mounting to the housing.

14. An antenna assembly comprising:

an antenna and a printed circuit board, said antenna comprising:

a generally elongate, magnetically permeable core having a major axis, and including integral mounting means comprising one or more flanges integrally formed as part of said core for mounting the antenna to the printed circuit board;

an insulating substrate being affixed to said core along an axis parallel to said major axis, said insulating substrate having a pair of opposed spaced conductive runners positioned along said substrate parallel to said major axis;

a plurality of charge storage devices secured between said pair of opposed spaced conductive runners;

an electrically conductive split sleeve positioned surrounding said core, said sleeve having first and second edge portions in electrical connection with said pair of opposed spaced conductive runners opposite said charge storage devices; and means coupled to said conductive runners for providing electrical contact separate from said mounting means, for coupling the antenna to the printed circuit board.

15. The antenna assembly of claim 14 wherein said core is a ferrite rod.

16. The antenna assembly of claim 14 wherein said insulating substrate further includes contact means coupled to said conductive runners for providing electrical connection between the antenna and the printed board.

17. The antenna assembly of claim 14 wherein said means for providing electrical contact comprises at least two contact tabs integral to said electrically conductive split sleeve and coupled to said conductive runners for providing separate electrical contact for the antenna to the printed circuit board.

* * * * *